United States Patent [19]

Ryczek

[11] Patent Number: 5,508,606
[45] Date of Patent: Apr. 16, 1996

[54] DIRECT CURRENT SENSOR

[75] Inventor: Lawrence J. Ryczek, Oconomowoc, Wis.

[73] Assignee: Eaton Corporation, Cleveland, Ohio

[21] Appl. No.: 232,936

[22] Filed: Apr. 25, 1994

[51] Int. Cl.$^6$ .................................................. G01R 33/00
[52] U.S. Cl. .................... 324/117 R; 324/127; 361/45; 348/627; 307/416; 307/417; 307/418
[58] Field of Search ................................ 324/117 R, 127, 324/102; 330/8; 307/416, 417, 418; 361/45; 348/627

[56] References Cited

U.S. PATENT DOCUMENTS

| | | | |
|---|---|---|---|
| 3,396,338 | 8/1968 | Buchanan et al. | 324/117 R |
| 3,467,864 | 9/1969 | Vander Plaats | 324/102 |
| 4,255,705 | 3/1981 | Milkovic | 324/127 |
| 4,320,433 | 3/1982 | Yamaki | 361/45 |
| 4,454,533 | 6/1984 | Iwasaki | 348/627 |
| 5,008,612 | 4/1991 | Otto | 324/117 R |
| 5,309,086 | 5/1994 | Johansson et al. | 324/117 R |

OTHER PUBLICATIONS

Paper entitled "Improving and Simplifying HF DC Current Sensors," by Rudolf Severns, Springtime Inc., 1986.

*Primary Examiner*—Kenneth A. Wieder
*Assistant Examiner*—Kourosh Cyrus Khosravi
*Attorney, Agent, or Firm*—Quarles & Brady

[57] ABSTRACT

Direct current can be measured by passing a conductor carrying the current through the core of a toroidal transformer having a bias winding and a sensing winding. A pulse generator send pulses of magnetization current through the sensing winding so that the magnetization current produces a magnetic flux in the core which opposes a magnetic flux produced by the direct current carried by the conductor. A sensing circuit, connected to the sensing winding, detects the level of current through that winding to produce a measurement of the direct current carried by the conductor. A constant direct current is applied through the bias winding to increase the magnetic flux produced by the direct current carried by the conductor. Biasing the magnetic flux enables even small currents flowing through the conductor to be measured. Another version of the current sensor uses two transformers to measure direct current flowing in either direction in the conductor and provides an indication of that current's polarity.

9 Claims, 2 Drawing Sheets

DIRECT CURRENT SENSOR

BACKGROUND OF THE INVENTION

The present invention relates to devices for measuring direct electrical current; and more particularly to such sensors which are isolated from the components which conduct the direct current being measured.

Current sensors find common application in many electrical power systems such as automotive load monitoring and control. Applications of such sensors include electrical overload detection, battery condition monitoring and excessive battery discharge warnings. In such applications, the currents can range from less than one ampere to tens of amperes. In non-automotive applications, it is desirable to measure direct currents of 100 amperes or more.

A common technique for sensing direct current was to provide a shunt path in which a known fraction of the total current flows and incorporate a current sensing device in the shunt path. By measuring the amount of current in the shunt path and knowing the fraction of the total current which flowed through the shunt, the level of the total current flowing in the circuit was determined. The disadvantage of shunt type sensors is that the sensor must be physically connected to the current conductor, often adding additional load to that circuit.

Another type of current sensor utilized a transformer which isolated the sensor from the circuit conducting the direct current being measured. In this case, the unknown direct current flowed through a conductor that passed directly through the center opening of a toroidal transformer thereby forming a single turn primary winding of the transformer. A secondary winding of the transformer had 1,000 to 5,000 turns. The flow of direct current through the primary conductor saturated the core of the transformer.

To sense the direct current, pulses of current were applied to the secondary winding in a direction to counter the saturation of the transformer core. Specifically, the current pulse in the secondary winding produced magnetic flux in the winding which countered magnetic flux produced by the direct current through the primary winding. When the two magnetic fluxes were equal, the magnitude of the current in the secondary winding stopped increasing. By sensing the peak current through the secondary winding and knowing the turns ratio between the primary and secondary windings, the magnitude of the direct current in the primary winding can be calculated. A current sensor of this type is described by Rudolf Severns in an article entitled, "Improving and Simplifying HF DC Current Sensors," published in 1986 by the Institute of Electrical and Electronic Engineers.

A transformer isolated direct current sensor can be modified to sense current conducting in either direction through the primary circuit. In this case, two transformers are used with each one being wound so that one will saturate when current flows in one direction through the primary circuit and the other transformer will saturate when the current flows in the opposite direction. Although such sensors measured the magnitude of the current flowing in either direction, they did not produce an indication of the polarity of that current.

Another problem was that conventional transformer isolated direct current sensors were unable to measure very small current levels. Even using transformer cores of high magnetic permeability, such current sensors commonly could not accurately measure currents below 0.1 ampere. Thus, a sensor of this type could not be used in circuits with relatively small current levels.

SUMMARY OF THE INVENTION

An object of the present invention is to provide a device for measuring direct current in which a transformer is utilized to isolate the device from the conductor carrying the current being measured.

Another object of the present invention is to provide a version of an isolated transformer direct current sensor which can accurately measure currents down to zero amperes.

These objects are achieved by a direct current sensor comprising a transformer having a core of magnetic material through which passes a conductor carrying a direct current to be sensed. A bias winding and a sensing winding are wound on the core and may each have a turns ratio which respect to the conductor of 1000 to 1 or greater.

A source applies pulses of magnetization current through the sensing winding wherein the magnetization current produces a magnetic flux in the annular core which opposes a magnetic flux produced by the direct current carried by the conductor. A sensing circuit is connected to the sensing winding of the transformer and senses the level of current through that winding to produce a signal that indicates a magnitude of the direct current carried by the conductor.

A direct current source is connected to apply a bias current of a substantially constant magnitude to the bias winding wherein the bias current produces a magnetic flux in the transformer core which increases the magnetic flux produced by the direct current carried by the conductor. The bias current increases the magnetic flux to a level at which even small currents flowing through the conductor can be measured by the direct current sensor.

A further object of the present invention is to provide a direct current sensor which is bi-directional and which provides an indication of the polarity of the direct current being measured.

This latter object is satisfied by adding a second transformer with a sensing winding wound on a magnetic core in which the conductor also passes through the core of the second transformer. The sensing windings of the transformers are connected in series in a manner that the magnetization current pulses produce magnetic flux in one transformer which opposes a magnetic flux produced by the direct current flowing in one direction through the conductor, and produces a magnetic flux in the other transformer which increases a magnetic flux produced by the direct current flowing in the one direction through the conductor. In this embodiment of the present invention neither transformer has a bias winding.

The sensing circuit is able to produce a indication of the magnitude of the direct current flowing through the conductor regardless of the direction, or polarity, of that current. A polarity circuit is provided to sense the voltage level at a node between the two series connected transformers and in response to that voltage level produce a signal indicating the polarity of direct current in the conductor.

DETAILED DESCRIPTION OF THE INVENTION

Figure 1:
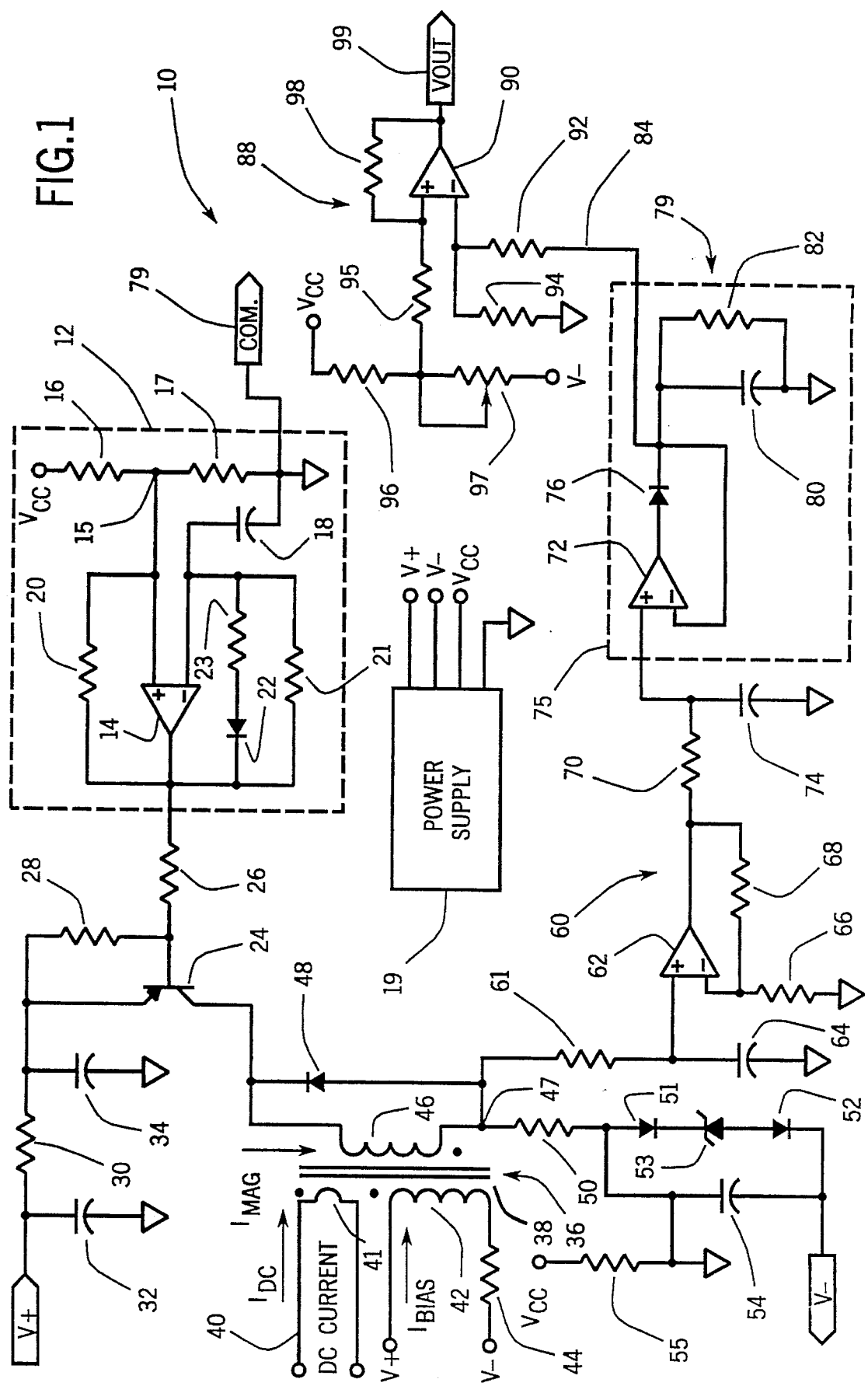
FIG. 1 is a schematic circuit diagram for sensing unidirectional direct current.

With initial reference to FIG. 1, a uni-directional current sensor 10 has a pulse generator 12 built around an operational amplifier 14. The non-inverting input of a first operational amplifier 14 is connected to the center node 15 of a voltage divider formed by resistors 16 and 17 connected in series between a positive supply voltage Vcc from power supply 19 and circuit ground. The inverting input of operational amplifier 14 is coupled to ground by a capacitor 18. A first feedback resistor 20 couples the output of the first operational amplifier 14 to its non-inverting input. The non-inverting input of the first operational amplifier 14 is connected to the amplifier output by a feedback circuit formed by resistor 21 connected in parallel with the series connection of diode 22 and resistor 23. The feedback resistors have values that are chosen so that the pulse generator 12 has a ten percent duty cycle to produce a series of relatively short duration, low-level output pulses at a frequency of 200 Hz.

The output of the pulse generator 12 controls a switch formed by drive transistor 24. Specifically, the output of operational amplifier 14 is coupled by resistor 26 to the base of drive transistor 24. The emitter of the drive transistor is connected to the base by resistor 28 and is connected by resistor 30 to a positive magnetizing voltage V+ from power supply 19. Opposite terminals of resistor 30 are coupled to ground by capacitors 32 and 34. As will be described, capacitor 34 acts as a storage capacitor for current pulses created by the switching of transistor 24.

A toroidal transformer 36 has a hollow cylindrical core 38 of magnetic material through which passes the conductor 40 which carries the direct current $I_{DC}$ to be measured, thereby forming a single turn primary winding 41. A 1000 turn bias winding 42 is wrapped toroidally around the transformer core 38. The bias winding 42 is connected to a constant current source such as provided by connecting a resistor 44 between the sources of positive and negative magnetizing voltages V+ and V−. Alternatively, if a high level of measurement precision is required, a regulated current source can be used to supply the bias current $I_{BIAS}$ to the bias winding 42. The ratio of the number of turns of the bias winding 42 to the number of turns of the primary winding 41 is 1,000 to 1, for example. The bias winding 42 is wound on the core 38 in a manner in which the magnetic flux produced in the core 38 by the bias current adds to the magnetic flux produced by the direct current $I_{DC}$ through primary winding 41.

The toroidal transformer 36 also has a sensing winding 46 would toroidally on core 38 with a first end connected to the collector of transistor 24. The sensing winding 46 is wound on the core 38 so that when a magnetizing current $I_{MAG}$ flows from the transistor 24 through that winding, a magnetic flux is created in core 38 which opposes the magnetic flux produced by the direct current $I_{DC}$ flowing through conductor 40. A diode 48 is connected across the sensing winding 46 with its cathode connected to the end of the winding which is coupled to the collector of transistor 24. The second end of the sensing winding 46 at node 47 is coupled to a negative magnetizing voltage V− from power supply 19 by a current sensing resistor 50, a pair of forward biased diodes 51 and 52 and a Zener diode 53 connected in series. A capacitor 54 is connected in parallel with the three series connected diodes 51–53. A node between resistor 50 and diode 51 is connected directly to ground and is coupled by a resistor 55 to the positive supply voltage Vcc.

The node 47 is connected to a current sensing circuit 60 which measures the voltage across current sensing resistor 50. Specifically, resistor 61 couples node 47 to the non-inverting input of a second operational amplifier 62 which input is also coupled to ground by capacitor 64. Resistor 61 and capacitor 64 act as a filter for noise at the input to the second operational amplifier 62. The inverting input of second operational amplifier 62 is connected to ground by resistor 66 and to the output of that operational amplifier by resistor 68.

The output of the second operational amplifier 62 is coupled by resistor 70 to the non-inverting input of a third operational amplifier 72 in which the non-inverting input is also coupled to ground by a capacitor 74. Resistor 70 and capacitor 74 act as a noise filter at the input to a peak detector 75 formed by the third operational amplifier 72. The output of the third operational amplifier 72 is connected by a diode 76 to a sample and hold circuit 79 formed by capacitor 80 and resistor 82, so that the signal level on output line 84 from the peak detector 75 remains relatively constant between pulses of the magnetization current $I_{MAG}$.

The voltage level on output line 84 from peak detector 75 indicates the magnitude of the direct current $I_{DC}$ flowing through conductor 40. However, that voltage level indicates a current magnitude that is one ampere greater than current $I_{DC}$ because of the effect of the bias current $I_{BIAS}$. Therefore the output of the peak detector 75 is applied to a offset correction circuit 88, which includes a fourth operational amplifier 90. The non-inverting input of the fourth operational amplifier 90 is coupled by resistor 92 to the peak detector output line 84 and to circuit ground by resistor 94. Resistor 98 is connected between the output of the fourth operational amplifier 90 and its inverting input. The inverting input of the fourth operational amplifier 90 also is connected by resistor 95 to a voltage divider formed by resistor 96 and potentiometer 97.

Adjustment of the potentiometer 97 allows the output of the fourth operational amplifier 90 to be nulled when current is not flowing through conductor 40 and only the effect of the bias current is being measured by the current sensing circuit 60. Thus the output of the offset correction circuit 88 at terminal 99 will be a true indication of the direct current $I_{DC}$ flowing through the conductor 40.

The operation of the current sensor 10 allows very small direct currents to be measured accurately. The direct current $I_{DC}$ which is carried by conductor 40 through the toroidal transformer 36 causes saturation of the core 38 of that transformer. The core 38 has a very high magnetic permeability and saturates at 0.1 ampere turns, thus allowing conventional techniques to sense a current in conductor 40 as low as 0.1 amperes and very linear sensing of current at 1 ampere and above. However, below 0.1 amperes, conventional sensing becomes non-linear and inaccurate. To overcome this conventional limitation, the present circuit provides a bias current $I_{BIAS}$ through a separate bias winding 42 of the transformer 36 which produces magnetic flux in core 38 in the same direction as magnetic flux from DC current $I_{DC}$ in primary winding 41. Thus the two magnetic fluxes add together. For example, a bias current $I_{BIAS}$ of one milliampere through the one-thousand turn bias winding 42 produces a magnetic flux in transformer core 38 which corresponds to the magnetic flux produced by one ampere flowing through primary winding 41. As a consequence, the core is pre-biased to a level at which accurate current sensing can occur. Since any current flowing through conductor 40 will produce magnetic flux that adds to the bias magnetic flux, even relatively small direct currents $I_{DC}$ below the 0.1 ampere level can be measured.

During measurement of the current, the pulse generator 12 pulses the switching transistor 24 on and off at a rate of 200 Hz. with a duty cycle of ten percent. This pulsing of transistor 24 applies voltage pulses to the sensing winding 46 of transformer 36 and produces a rapid build-up of magnetizing current $I_{MAG}$ through that winding. The magnetizing current continues to increase until the magnetic flux produced in the core 38 by that current equals the level of magnetic flux produced by the currents in windings 42 and 41. It should be noted that the flux produced by the sensing winding 46 opposes the flux produced by the other windings 41 and 42. When the counteracting magnetic fluxes match each other, the level of the magnetizing current $I_{MAG}$ in the sensing winding 46 becomes relatively constant and corresponds to the sum of the currents $I_{DC}$ and $I_{BIAS}$ in the other transformer windings 41 and 42.

In order to ensure that the magnetic fluxes will counterbalance, the maximum level of the magnetizing current $I_{MAG}$ must be proportional based on the turns ratio of the transformer to the maximum level of the direct current $I_{DC}$ to be measured in conductor 40. For example, if the turns ratio of the sensing winding 46 to the primary winding 41 of conductor 40 is 1,000 to 1, a ten milliampere magnetizing current $I_{MAG}$ is required to sense up to a ten ampere DC current $I_{DC}$ in conductor 40. Although it is possible to connect a ten milliampere power supply across terminals V+ and V−, the present circuit allows a smaller current source to be utilized. Since the pulse generator 12 produces pulses having a ten percent duty cycle, a one milliampere power supply can be connected to the magnetizing voltage terminals V+ and V−. While transistor 24 is nonconductive, voltage builds up across storage capacitor 34. The magnetizing current applied to transformer 36 by turning on transistor 24 comes essentially from the storage capacitor 34. Therefore, since an average one milliampere current is required for sensing, the power supply need only furnish that level of current and capacitor 34 provides a sufficient current source for the short pulses of ten milliamperes of magnetizing current. In addition, the relatively short pulses prevent core 38 of the toroidal transformer 36 from going into reverse saturation since before that can occur, the current pulse terminates. In addition, the relatively long duration between pulses allows the current in the conductor 40 to saturate core 38 again before the next pulse of magnetizing current $I_{MAG}$.

The magnetizing current through the sensing winding 46 also flows through the current sensing resistor 50 thereby producing a voltage drop across that resistor that is proportional to the magnitude of the current. The sensing circuit 60 detects the peak level of the voltage across the current sensing resistor and thus the peak magnetizing current $I_{MAG}$ conducting through the sensing winding 46. As noted previously, the peak level of magnetizing current corresponds to the unknown direct current $I_{DC}$ in conductor 40. Specifically, the voltage at node 47 between the sensing winding 46 and current sensing resistor 50 is applied to an integrating noise filter formed by resistor 61 and capacitor 64. The resultant signal is amplified by the second operational amplifier 62 and applied to the peak voltage detector 75. Thus, the output of the peak voltage detector 75 produced on line 84 is related to the maximum level of the magnetizing current $I_{MAG}$ which occurred when the magnetic flux produced by the magnetizing current counters the magnetic flux produced by the currents in windings 41 and 44. However the voltage level at the peak detector output corresponds to a current magnitude that is one ampere greater than the magnitude of the direct current $I_{DC}$ in conductor 40 due to the effect of the one milliampere bias current $I_{BIAS}$ through the 1000 turn bias winding 42. Thus, when the output of the peak detector 75 indicates a one ampere current level, zero current is flowing through the conductor 40, thereby allowing very small currents in conductor 40 to be sensed. The offset correction circuit removes this one ampere bias to produce a voltage level at terminal $V_{OUT}$, referenced to circuit ground at terminal 79, that accurately indicates the current level in conductor 40.

Figure 2:
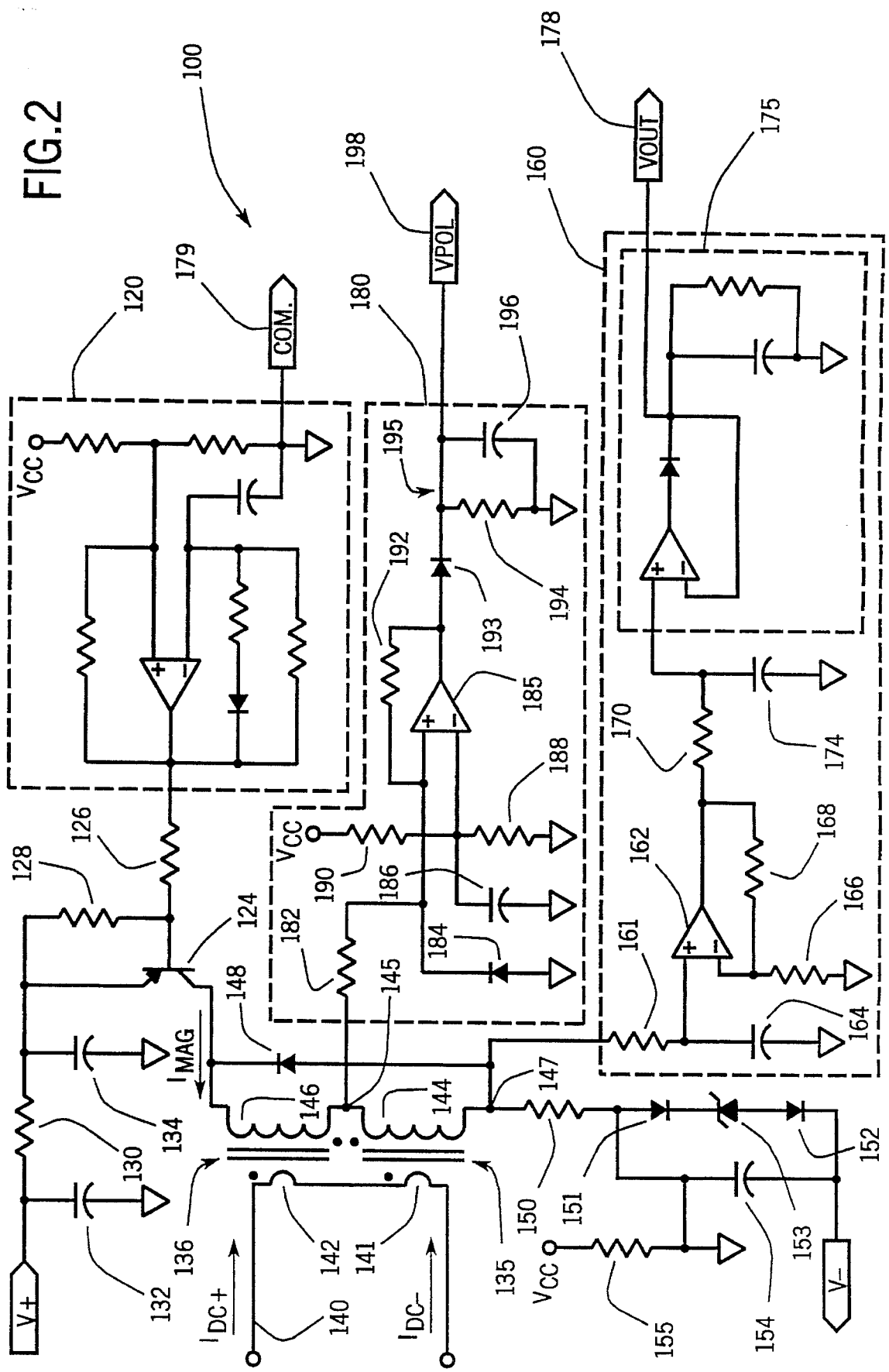
FIG. 2 is a schematic diagram of a circuit for a bi-directional direct current sensor.

With reference to FIG. 2, another version of the direct current sensor is able to measure direct current flowing in either direction through a conductor. The bi-directional current sensor 100 has a pulse generator 120 of the same design and operational characteristics as the pulse generator 12 in FIG. 1. Specifically, the pulse generator 120 produces short low-level pulses at a ten percent duty cycle and a frequency of 200 Hz. The output of pulse generator 120 is coupled by resistor 126 to a drive transistor 124 with its emitter and base coupled by resistor 128. The emitter of the drive transistor 124 is connected to a storage capacitor 134 and is coupled to a source of positive magnetizing voltage V+ by an RC filter comprising resistor 130 and capacitor 132.

The collector of the drive transistor 124 is connected to first and second sensing windings 144 and 146 of first and second toroidal transformers 135 and 136. The two sensing windings 144 and 146 are connected in series and are wound in opposite directions on the respective cores of the first and second toroidal transformers 135 and 136. The conductor 140 that carries the direct current being measured passes directly through the center opening of each toroidal transformer 136 and 135, thus creating the equivalent of a one-turn primary winding 141 and 142, respectively, on those transformers. The remote end of the first sensing winding 144 is connected to node 147 and a diode 148 is in parallel across both of the first and second transformers 135 and 136. Node 147 is connected to ground by the series connection of a current sensing resistor 150, a pair of diodes 151 and 152, and a Zener diode 153. A capacitor 154 is connected in parallel with the series connected diodes 151–153 and resistor 155 couples an end of the diode series that is proximate to sensing resistor 150 to a source of positive supply voltage Vcc while the remote end of the diode series is connected to a source of negative magnetizing voltage V−.

The voltage across the current sensing resistor 150 is proportional to the current through the sensing windings 144 and 146 and thus the direct current in conductor 140. That voltage is measured by coupling node 147 to the current sensing circuit 160 which comprises an integrating filter formed by resistor 161 and capacitor 164. The filter is connected to an amplifier circuit formed by operational amplifier 162 and resistors 166 and 168. The output of operational amplifier 162 is coupled to a peak detector circuit 175 by a noise filter formed by resistor 170 and capacitor 174. The peak detector 175 produces an output voltage at terminal 178 which indicates the magnitude of current flowing through conductor 140.

Since the current sensor 100 is able to measure direct current flowing in either direction through conductor 140, a polarity detector circuit 180 has been provided to produce an indication of the polarity of that direct current. The input to polarity detector circuit 180 is connected to node 145 between the two series connected sensing windings 144 and 146. The node 145 is connected by resistor 182 to the non-inverting input of operational amplifier 185 which input is also connected cathode of a diode 184 having its anode connected to circuit ground. The inverting input of operational amplifier 185 receives a reference voltage from a voltage divider formed by resistors 188 and 190 connected between positive voltage Vcc and circuit ground. The inverting input of operational amplifier 185 also is coupled to circuit ground by capacitor 186. A feedback resistor 192 connects the output of the operational amplifier 185 to its non-inverting input. The output of operational amplifier 185 is applied through an isolation diode 193 to a sample and hold circuit 195 formed by resistor 194 and capacitor 196.

As noted previously, the bi-directional current sensor 100 is able to measure a direct current flowing in either direction through conductor 140. When a current is flowing in one direction, as indicated by the arrow labelled $I_{DC+}$, the cores of both the first and second transformers 135 and 136 will be saturated. Then when the pulse generator 120 turns on drive transistor 124, a pulse of magnetizing current $I_{MAG}$ is sent through sensing windings 144 and 146 of the two transformers. The sensing windings 144 and 146 are wound in opposite directions around the transformer cores. Therefore, the magnetic flux produced by the magnetizing current $I_{MAG}$ will oppose the magnetic flux in the second transformer 136 which was produced by the direct current $I_{DC+}$ flowing in conductor 140, and the magnetizing current $I_{MAG}$ in sensing winding 144 of the first transformer 135 will produce a magnetic flux in the same direction as the magnetic flux produced by the current $I_{DC+}$.

When drive transistor 124 is pulsed into a conductive state, the magnetizing current $I_{MAG}$ will rise to a level that is proportional to the magnitude of the direct current $I_{DC+}$ in conductor 40 with the proportionality relationship being the same as the turns ratio between the sensing windings and the primary winding for the conductor 140. In the present example, this proportionality is 1,000 to 1.

The current flowing through the sensing windings also flows through current sensing resistor 150 and produces a voltage across that resistor which is proportional to the magnitude of that current, and thus the current in conductor 140. The voltage across current sensing resistor 150 is sensed by the peak detector 175 in a manner similar to that previously described for the embodiment of the circuit in FIG. 1. Therefore, the voltage $V_{out}$ produced at output terminal 178, referenced to the common terminal 179, has a value that is proportional to the magnitude of the current $I_{DC+}$ in conductor 140.

In this situation, there will be a voltage drop across the second sensing winding 146 and minimal voltage drop across the first sensing winding 144. The voltage applied to the non-inverting input of operational amplifier 185 will not exceed the reference voltage applied to its inverting input producing a relatively low signal level output from the amplifier. When the output of operational amplifier 185 goes low, any higher voltage across capacitor 196 will discharge through resistor 194 so that the circuit ground potential appears at terminal 198. Therefore, the polarity signal $V_{POL}$ will be at a low signal level when the current in conductor 140 flows in direction $I_{DC+}$.

When the direct current flows in the opposite direction through the conductor 140, as indicated by arrow $I_{DC-}$, the current flow through primary windings 141 and 142 of the first and second toroidal transformers 135 and 136 will produce saturation of those transformers by a magnetic flux which flows in the opposite direction to the magnetic flux when current $I_{DC+}$ flowed through the conductor. Now when drive transistor 124 is pulsed into a conductive state, the resultant magnetizing current $I_{MAG}$ flowing through the sensing windings 144 and 146 will produce a counter magnetic flux within the first transformer 135 and an additive magnetic flux within the second transformer 136. Thus, the second transformer 136 will remain in saturation and the magnetization current $I_{MAG}$ through the sensing winding 144 will drive the first transformer 135 out of saturation. Current $I_{MAG}$ will rise to a magnitude which is proportional to current $I_{DC-}$. The level of the magnetizing current $I_{MAG}$ will be measured by peak detector 175 in the same manner as described with respect to the current flowing in the opposite direction through conductor 140 so that the voltage $V_{OUT}$ at terminal 178 will be proportional to the current level $I_{DC}$ flowing through conductor 140.

Since the second transformer 136 remains in saturation, there will be minimal voltage drop across its sensing winding 146 and a significant voltage drop across sensing winding 144 of the first transformer 135. Thus, a relatively high voltage level will be present at node 145 between those sensing windings. This voltage level is greater than the reference voltage applied to the inverting input of that operational amplifier 185 producing a high signal level output from that operational amplifier 185. This high signal level is stored across capacitor 196. The decay time constant of the RC circuit formed by capacitor 196 and resistor 194 is sufficiently long so that this high signal level remains stored across capacitor 196 between pulses of the pulse generator 120. Therefore, a continuously high level polarity signal $V_{POL}$ appears at output terminal 198 while current is flowing through conductor 140 in the direction indicated at $I_{DC-}$.

The bi-directional current sensing circuit 100 is able to accurately measure direct current flowing in either direction through conductor 140 and produce a voltage at output terminal 178 that indicates that current level. That voltage is related to the current based on the value of resistor 150, the turns ratio between the sensing windings 144 and 146 and the windings 141 and 142 of conductor 140. It should be noted that transformers 135 and 136 of the current sensor 100 do not have a bias winding and therefore are only able to sense currents above a threshold magnitude, for example 0.1 amperes in either direction through conductor 140.

I claim:

1. A direct current sensor comprising:

a transformer having an annular core of magnetic material through which passes a conductor carrying a direct current to be sensed, a bias winding wound on the annular core, and a sensing winding wound on the annular core;

a source of magnetization current coupled to the sensing winding of said transformer wherein the magnetization current is applied as pulses to the sensing winding so that the magnetization current produces in the annular core a magnetic flux which opposes a magnetic flux produced by the direct current carried by the conductor;

a sensing circuit connected to the sensing winding of the transformer and responding to current flowing through the sensing winding by producing a signal that indicates a magnitude of the direct current carried by the conductor; and a direct current source connected to the bias winding for applying a bias direct current of a substantially constant magnitude to the bias winding, wherein the bias direct current produces in the annular core a magnetic flux which increases the magnetic flux produced by the direct current carried by the conductor.

2. The direct current sensor as recited in claim 1 wherein said transformer has a turns ratio between the sensing winding and the conductor of at least 1000 to 1.

3. The direct current sensor recited in claim 1 wherein the bias and sensing windings have equal numbers of turns.

4. The direct current sensor as recited in claim 1 wherein said transformer has a turns ratio between the bias winding and the conductor of at least 1000 to 1.

5. The direct current sensor as recited in claim 1 wherein said source of magnetization current comprises:
   a terminal for connection to a current supply;
   a pulse generator having an output; and
   a drive transistor having a control electrode connected to the output of said pulse generator and having a conduction path coupling the sensing winding to said terminal.

6. The direct current sensor as recited in claim 1 wherein said source of magnetization current comprises:
   a pulse generator having an output at which is produced a pulsed signal having a duty cycle of X percent, where X is a positive number between zero and one-hundred;
   a terminal for connection to a current supply which is able to supply a magnitude of current of at least (YX)/100 amperes where Y is a maximum magnitude of the magnetization current;
   a capacitor connected to the terminal wherein voltage applied to said terminal is stored across said capacitor; and
   a drive transistor having a control electrode connected to the output of said pulse generator and having a conduction path coupling said capacitor to the sensing winding.

7. The direct current sensor as recited in claim 1 wherein said sensing circuit comprises resistor connected in series with the sensing winding and through which the magnetization current flows; and a detector which measures peak voltage across the resistor and produces the signal.

8. The direct current sensor as recited in claim 1 wherein said sensing circuit comprises a resistor connected in series with the sensing winding and through which the magnetization current flows; an amplifier having an input and an output; an integrating filter connecting the resistor to the input of said amplifier; and a peak voltage detector connected to the output of said amplifier and having a signal output at which the signal is produced.

9. The direct current sensor as recited in claim 8 wherein said sensing circuit further comprises a sample and hold circuit connected to the signal output of said peak voltage detector.

* * * * *